(12) United States Patent
Hirano

(10) Patent No.: US 6,433,582 B2
(45) Date of Patent: *Aug. 13, 2002

(54) VOLTAGE LEVEL SHIFTER CIRCUIT

(75) Inventor: Yasuaki Hirano, Yamatokoriyama (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/025,995

(22) Filed: Feb. 19, 1998

(30) Foreign Application Priority Data

Feb. 25, 1997 (JP) .............................. 9-041030

(51) Int. Cl.$^7$ ........................................... H03K 19/094
(52) U.S. Cl. .............................. 326/68; 326/80; 326/81; 326/86; 326/121
(58) Field of Search .............................. 326/68, 80–81, 326/83, 86, 121, 26–27; 327/333, 67

(56) References Cited

U.S. PATENT DOCUMENTS

| 4,001,606 A | | 1/1977 | Dingwall | |
|---|---|---|---|---|
| 4,486,670 A | | 12/1984 | Chan et al. | |
| 4,859,870 A | * | 8/1989 | Wong et al. | ................. 327/108 |
| 5,019,729 A | * | 5/1991 | Kimura et al. | ................. 326/86 |
| 5,301,151 A | | 4/1994 | Wells et al. | |
| 5,583,457 A | | 12/1996 | Horiguchi et al. | |
| 5,666,069 A | * | 9/1997 | Gibbs | ........................... 326/81 |
| 5,847,581 A | * | 12/1998 | Allen | ........................... 326/81 |

FOREIGN PATENT DOCUMENTS

| EP | 0 703 665 A2 | 3/1996 | |
|---|---|---|---|
| GB | 2 113 936 A | 8/1983 | |
| JP | 60-33734 | * 2/1985 | ................. 326/81 |
| JP | 2037823 | 2/1990 | |
| JP | 6236694 | 8/1994 | |
| JP | 6-260906 | 9/1994 | |

OTHER PUBLICATIONS

Sedra et al. Microelectronic Circuits & Devices. Prentice Hall, p. 343, 1987.*

* cited by examiner

*Primary Examiner*—Michael G. Lee
*Assistant Examiner*—Steven S. Paik
(74) *Attorney, Agent, or Firm*—Morrison & Foerster LLP

(57) ABSTRACT

A voltage level shifter circuit includes a first transistor having a source, a drain, and first and second gates; a second transistor having a source, a drain, and first and second gates; and a switching section for receiving an input signal and changing respective voltages to be applied to first and second nodes, wherein one of the source and the drain of each of the first and second transistors is connected to a third node, the first gate of each of the first and second transistors is connected to the third node, the other of the source and the drain of the first transistor and the second gate of the second transistor are connected to the first node, and the other of the source and the drain of the second transistor and the second gate of the first transistor are connected to the second node, the voltage level shifter circuit further including a resistance equivalent element having first and second ends, a high voltage being applied to the first end, and the second end being are connected to the third node.

16 Claims, 10 Drawing Sheets

VOLTAGE LEVEL SHIFTER CIRCUIT

BACKGROUND OF THE INVENTION

1. Field of the Invention

The present invention relates to a voltage level shifter circuit for shifting a voltage of an input signal to a high voltage or a negative voltage.

2. Description of the Related Art

Devices using a voltage different from a voltage of an input signal include a flash memory and an electrically erasable and programmable read only memory (EEPROM). In such devices, a voltage of an input signal must be shifted to a high voltage or a negative voltage. A circuit for conducting such shifting is referred to as a level shifter. Note that, in this specification, a high voltage refers to a voltage higher than that of an input signal. A voltage of an input signal is 3 V or 5 V, for example. A high voltage is 8 V, 10 V or 12 V, for example.

Japanese Laid-Open Publication No. 6-236694 discloses a high voltage level shifting circuit as shown in FIG. 14.

When a voltage at an input terminal T1 is Vcc, a transistor N1 is turned on, and a transistor N2 is turned off. In this case, transistors P2 and N1 are turned on. As a result, the voltage level shifter circuit outputs from its output terminal T2 a signal having a voltage Vpp through the transistor P2 as well as outputs from its output terminal T3 a signal having a voltage Vss through the transistor N1.

When a voltage at the input terminal T1 is Vss, the transistors N1 and P2 are turned off, whereas the transistors N2 and P1 are turned on. As a result, the voltage level shifter circuit outputs from the output terminal T2 a signal having a reference voltage Vss through the transistor N2 as well as outputs from the output terminal T3 a signal having a voltage Vpp through the transistor P1.

In this case, a voltage Vcc is 3 V, for example, a voltage Vss is 0 V, for example, and a high voltage Vpp is 10 V, for example.

Japanese Laid-Open Publication No. 58-125298 discloses a digital level shifter with low power consumption as shown in FIG. 15.

When a voltage at an input terminal T1 is Vcc, a voltage at a node nd5 is Vss, whereby a transistor P2 is turned on. In this case, a voltage at a node nd6 is Vcc, whereby a transistor P1 is turned off. As a result, the level shifter outputs a signal having a voltage Vpp from its output terminal T2 as well as outputs a signal having a voltage Vss from its output terminal T3.

When a voltage at the input terminal T1 is at Vss, a voltage at the node nd5 is Vcc, whereby the transistor P2 is turned off. In this case, a voltage at the node nd6 is Vss, whereby the transistor P1 is turned on. As a result, the level shifter outputs a signal having a voltage Vss from the output terminal T2 as well as outputs a signal having a voltage Vpp from the output terminal T3.

FIG. 16 shows a general negative-voltage shifter circuit.

When a voltage at an input terminal T1 is Vcc, a transistor P1 is turned off, whereas a transistor P2 is turned on. Therefore, a transistor N1 is turned on, and a transistor N2 is turned off. As a result, the negative-voltage shifter circuit outputs a signal having a voltage Vcc from its output terminal T2 as well as outputs a signal having a voltage Vn from its output terminal T3.

When a voltage at the input terminal T1 is Vss, the transistor P1 is turned on, and the transistor P2 is turned off. Therefore, the transistor N1 is turned off, and the transistor N2 is turned on. As a result, the negative-voltage shifter circuit outputs a signal having a voltage Vn from the output terminal T2 as well as outputs a signal having a voltage Vcc from the output terminal T3.

In this case, a voltage Vcc is 3 V, for example, a voltage Vss is 0 V, for example, and a negative voltage Vn is −8 V, for example.

The voltage level shifter circuit as shown in FIG. 14 has the following problems when an input signal Si transtions from a voltage Vcc to a voltage Vss.

When the input signal Si having a voltage Vss is input, the transistor N1 is turned off. At this time, the transistor P1 is in an off state, and therefore a voltage at a node nd1 is kept at Vss Then, the transistor N2 is turned on. At this time, the transistor P2 is still in an on state, and therefore a through current flows through the transistors P2 and N2.

A parasitic load is produced between a terminal T5 to which a voltage Vss is applied and a node nd2. Accordingly, a voltage at a node nd4 is increased. When the voltage at the node nd4 rises to the value Vpp-Vthp1, the transistor P1 will not be turned on. Vthp1 herein refers to a threshold voltage for turning on the transistor P1.

As a result, the transistors P2 and N2 are kept in an on state, and a through current continues to flow through the transistors P2 and N2. Accordingly, the voltage level shifter circuit of FIG. 14 does not invert a voltage level.

The voltage level shifter circuit as shown in FIG. 15 has the following problems when an input signal Si transtions from a voltage Vcc to a voltage Vss.

When the input signal Si transtions from a voltage Vcc to a voltage Vss, a voltage at the node nd5 becomes Vcc. In this case, the transistor P1 is kept in an off state, and therefore a voltage at a node nd1 rises to the value Vcc-Vthn1. Vthn1 refers to a threshold voltage for turning on the transistor N1.

Then, a voltage at the node nd6 becomes Vss. Since the transistor P1 is in an off state, the voltage at the node nd1 is kept at the value Vcc-Vthn1. A voltage Vcc-Vthn1 is a voltage which is equal to or lower than a voltage Vpp-Vthp2. Vthp2 refers to a threshold voltage for turning on the transistor P2. Thus, the transistor P2 is still in an on state, and therefore a through current flows through the transistor P2, the transistor N2, and a part of an inverter INV3. Actually, a parasitic resistance is produced between a node nd2 and the terminal T2 which receives a reference voltage Vss, and therefore a voltage at a node nd4 rises. In the case where the voltage at the node nd4 is equal to or higher than the voltage Vpp-Vthp1, the transistor P1 is kept in an off state. Thus, the voltage at the node nd1 is kept at the value Vcc-Vthn1, and therefore the transistor P2 will not be turned off. As a result, a through current continues to flow through the transistor P2, the transistor N2, and a part of the inverter INV3. Accordingly, the voltage level shifter circuit as shown in FIG. 15 does not invert a voltage level.

The voltage level shifter circuit as shown in FIG. 16 has the following problems when an input signal Si transtions from a voltage Vcc to a reference voltage Vss.

When the voltage of the input signal transtions from a voltage Vss to a voltage Vcc, the transistor P1 is first turned off.

At this time, the transistor N1 is still in an on state, and a voltage at the node nd11 is slightly lower than the voltage Vcc. Therefore, the transistor N2 is kept in an on state. When the transistor P2 is turned on thereafter, a through current flows through the transistors P2 and N2. Accordingly, a voltage at a node nd15 falls to a value lower than the voltage Vcc.

It is now assumed that a voltage at a node nd12 falls to 1.5 V due to the influences of a parasitic load and the like. Then, a voltage at the back-gate of the transistor P2 drops, significantly degrading the current driving capability of the transistor P2.

Because of a significantly high channel resistance of the transistor P2, a voltage at a node nd14 falls to a value which is very close to a voltage Vn. It is noted that the voltage at the node nd14 is determined by a ratio of the channel resistance between the transistors P2 and N2.

In the case where the voltage at the node nd14 is lower than the value Vn+Vthn1, the transistor N1 will not be turned on. Vthn1 herein refers to a threshold voltage for turning on the transistor N1. Since a voltage at the node nd11 does not transition, the transistor N2 will be kept in an on state. As a result, a through current continues to flow through the transistors P2 and N2. Accordingly, the voltage level shifter circuit of FIG. 16 does not invert a voltage level.

SUMMARY OF THE INVENTION

A voltage level shifter circuit according to one aspect of the present invention includes a first transistor having a source, a drain, and backgate and gate; a second transistor having a source, a drain, and backgate and gate; and a switching section for receiving an input signal and changing respective voltages to be applied to first and second nodes, wherein one of the source and the drain of each of the first and second transistors is connected to a third node, the backgate of each of the first and second transistors is connected to the third node, the other of the source and the drain of the first transistor and the gate of the second transistor are connected to the first node, and the other of the source and the drain of the second transistor and the gate of the first transistor are connected to the second node, the voltage level shifter circuit further including a resistance equivalent element having first and second ends, a high voltage being applied to the first end, and the second end being connected to the third node.

In one embodiment, the resistance equivalent element is a resistor.

In one embodiment, the resistance equivalent element has at least one p-channel MOS transistor.

In one embodiment, the resistance equivalent element has first and second p-channel MOS transistors, and a channel width of the first p-channel MOS transistor is larger than a channel width of the second p-channel MOS transistor.

A voltage level shifter circuit according to another aspect of the present invention includes a first transistor having a source, a drain, and backgate and gate; a second transistor having a source, a drain, and backgate gate; and a switching section for receiving an input signal and changing respective voltages to be applied to first and second nodes, wherein one of the source and the drain of each of the first and second transistors is connected to a third node, the backgate of each of the first and second transistors is connected to the third node, the other of the source and the drain of the first transistor and the gate of the second transistor are connected to the first node, and the other of the source and the drain of the second transistor and the gate of the first transistor are connected to the second node, the voltage level shifter circuit further including a resistance equivalent element having first and second ends, a negative voltage being applied to the first end, and the second end being connected to the third node.

In one embodiment, the resistance equivalent element is a resistor.

In one embodiment, the resistance equivalent element has at least one n-channel MOS transistor.

In one embodiment, the resistance equivalent element has first and second n-channel MOS transistors, and a channel width of the first n-channel MOS transistor is larger than a channel width of the second n-channel MOS transistor.

A voltage level shifter circuit according to still another aspect of the present invention includes a first transistor having a source, a drain, and backgate and gate; a second transistor having a source, a drain, and backgate gate; a third transistor having a source, a drain, and backgate and gate; a fourth transistor having a source, a drain, and backgate gate; and a first switching section for receiving an input signal and changing respective voltages to be applied to first and second nodes, wherein one of the source and the drain of each of the first and second transistors is connected to a third node, the backgate of each of the first and second transistors is connected to the third node, the other of the source and the drain of the first transistor and the gate of the second transistor are connected to the first node, the other of the source and the drain of the second transistor and the gate of the first transistor are connected to the second node, one of the source and the drain of each of the third and fourth transistors is connected to a fourth node, the backgate of each of the third and fourth transistors is connected to the fourth node, the other of the source and the drain of the third transistor and the gate of the fourth transistor are connected to a fifth node, and the other of the source and the drain of the fourth transistor and the gate of the third transistor are connected to a sixth node, the voltage level shifter circuit further including a second switching section for changing respective voltages to be applied to the fifth and sixth nodes based on respective voltages at the first and second nodes; a first resistance equivalent element having first and second ends, a voltage being applied to the first end, and the second end being connected to the third node; and a second resistance equivalent element having first and second ends, a negative voltage being applied to the first end of the second resistance equivalent element, and the second end of the second resistance equivalent element being connected to the fourth node.

In one embodiment, the first and second resistance equivalent elements are resistors.

In one embodiment, the first resistance equivalent element has at least one p-channel MOS transistor and the second resistance equivalent element has at least one n-channel MOS transistor.

In one embodiment, the first resistance equivalent element has first and second p-channel MOS transistors, a channel width of the first p-channel MOS transistor being larger than a channel width of the second p-channel MOS transistor, and the second resistance equivalent element has first and second n-channel MOS transistors, a channel width of the first n-channel MOS transistor being larger than a channel width of the second p-channel MOS transistor.

Thus, the invention described herein makes possible the advantage of providing a voltage level shifter circuit capable of stably inverting a voltage level upon transition of a voltage level of an input signal.

This and other advantages of the present invention will become apparent to those skilled in the art upon reading and understanding the following detailed description with reference to the accompanying figures.

DESCRIPTION OF THE PREFERRED EMBODIMENTS

Example 1

A structure of a voltage level shifter circuit according to a first example of the present invention will now be described with reference to FIG. 1.

Figure 1:
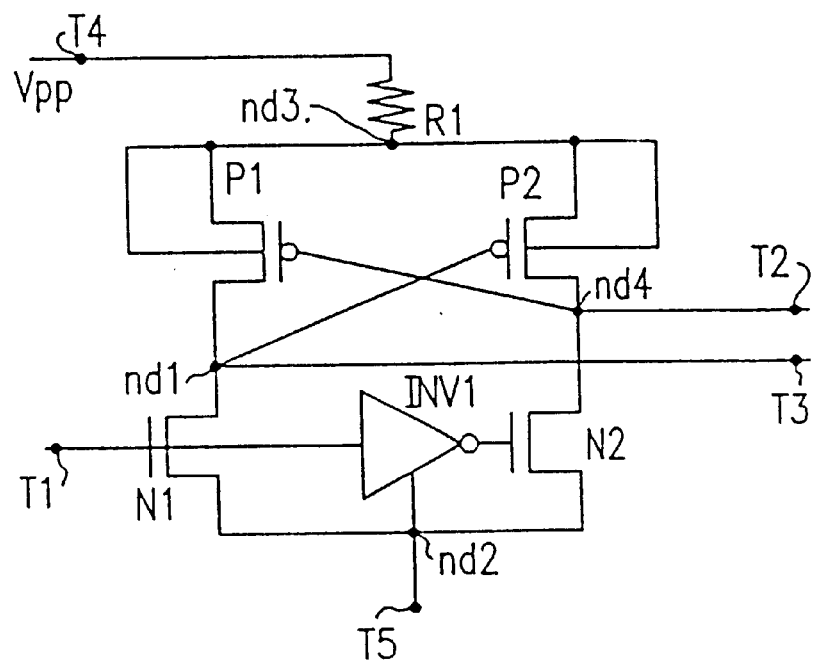
FIG. 1 is a diagram showing a voltage level shifter circuit according to a first example of the present invention.

FIG. 1 shows a structure of the voltage level shifter circuit according to the first example of the present invention. The voltage level shifter circuit shown in FIG. 1 changes respective voltages of output signals So1 and So2 which are output from output terminals T2 and T3, in response to an input signal Si to an input terminal T1.

The voltage level shifter circuit shown in FIG. 1 includes transistors P1, P2, N1 and N2 each having a source, a drain and gates; an inverter INV1; a resistor R1; an input terminal T1; output terminals T2 and T3; and terminals T4 and T5.

The connection in the above-described structure will now be described.

The input terminal T1 is connected to the gate of the transistor N1. One of the source and the drain of the transistor N1 is connected to a node nd1, whereas the other is connected to a node nd2. The node nd1 is connected to the terminal T3 for outputting an output signal So2. The node nd2 is connected to the terminal T5 for applying a reference voltage Vss. It is noted that a voltage Vpp is herein higher than the reference voltage Vss.

One of the source and the drain of the transistor Pi is connected to a node nd3, whereas the other is connected to the node nd1. One of the gates of the transistor P1 is connected to the node nd3, whereas the other is connected to a node nd4. The node nd3 is connected through the resistor R1 to the terminal T4 for applying a voltage Vpp. The node nd4 is connected to the terminal T2 for outputting an output signal So1.

One of the source and the drain of the transistor P2 is connected to the node nd3, whereas the other is connected to the node nd4. One of the gates of the transistor P2 is connected to the node nd3, whereas the other is connected to the node nd1.

One of the source and the drain of the transistor N2 is connected to the node nd4, whereas the other is connected to the node nd2.

An input terminal of the inverter INV1 is connected to the gate of the transistor N1, whereas an output terminal of the inverter INV1 is connected to the gate of the transistor N2.

An operation of the voltage level shifter circuit shown in FIG. 1 at a time when an input signal Si transtions from a voltage Vcc to a reference voltage Vss will now be described.

When the input signal Si has a voltage Vcc, the transistors N1 and P2 are turned on, and the transistors P1 and N2 are turned off.

When the input signal Si transitions from a voltage Vcc to a reference voltage Vss, the transistor N1 is turned off. Then, the inverter INV1 receives the signal of a reference voltage Vss at its input terminal, and outputs a signal of a voltage Vcc from its output terminal to the gate of the transistor N2. The transistor N2 is thus turned on.

At this time, the transistor P2 is still in an on state, and therefore a through current flows through the transistors P2 and N2. As a result, a voltage at the node nd2 rises.

A voltage at the node nd4 obtained at this time is determined by a ratio between "resistance between the terminal T4 and the node nd4" and "resistance between the node nd4 and the terminal T5." The "resistance between the terminal T4 and the node nd4" herein refers to the "total resistance value of parasitic resistance depending on a voltage Vpp, on-state resistance of the transistor P2, and resistor R1." The "resistance between the node nd4 and the terminal T5" herein refers to the "total resistance value of on-state resistance of the transistor N2 and parasitic resistance depending on a reference voltage Vss." The parasitic resistance depending on a voltage Vpp herein refers to parasitic resistance produced between the terminal T4 and the node nd4, and the parasitic resistance depending on a reference voltage Vss refers to parasitic resistance produced between the terminal T5 and the node nd2.

In the first example, the resistor R1 is inserted between the terminal T4 and the node nd3. Therefore, a current flowing through the nodes nd3, nd4 and nd2 is limited, and a voltage being raised due to the "resistance between the terminals T4 and T5" is small. In other words, a voltage at the node nd4 can be reduced by increasing a resistance of the resistor R1.

Since a voltage at the node nd1 is lower than the value "Vpp-Vthp1," the transistor P1 is turned on. Therefore, a voltage at the output terminal T3 rises and the transistor P2 is turned off. Vthp1 refers to a threshold voltage for turning on the p-channel transistor P1. Since the resistor R1 is inserted between the terminal T4 and the node nd3, the voltage level shifter circuit shown in FIG. 1 correctly performs an inverting operation.

In the case where the voltage level shifter circuit shown in FIG. 1 is to be formed on a silicon substrate, the resistor R1 may be a diffused resistor. The resistor R1 may also be formed of polysilicon.

In general, a number of voltage level shifter circuits are used in devices such as a decoder. When a plurality of voltage level shifter circuits operate simultaneously, parasitic resistance produced between the terminal T5 and the nodes nd4 of each of the voltage level shifter circuits is significantly increased respectively.

Figure 14:
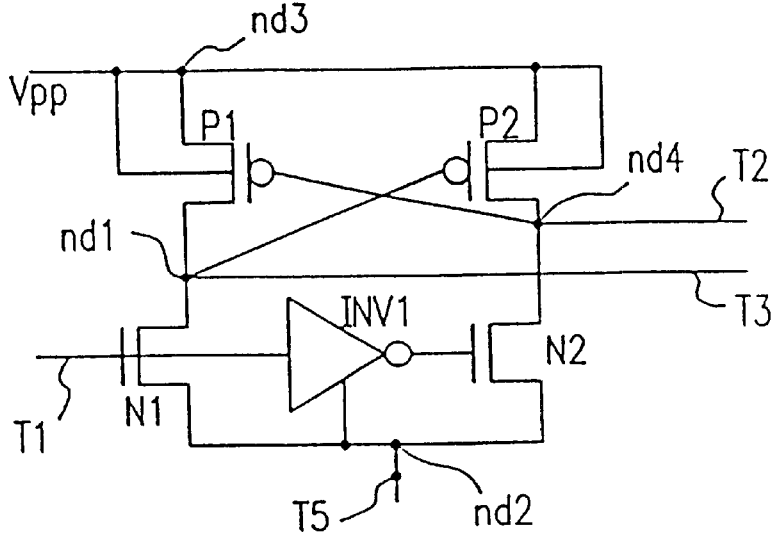
FIG. 14 is a diagram showing a conventional voltage level shifter circuit.
Figure 15:
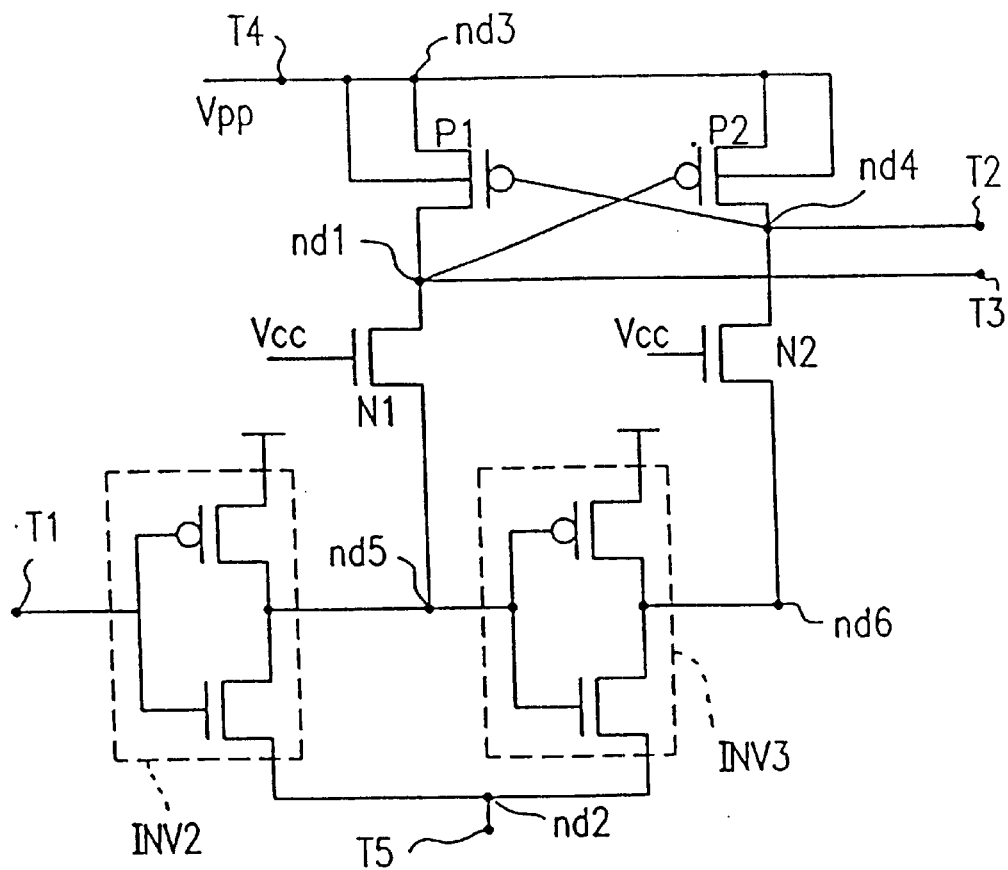
FIG. 15 is a diagram showing another conventional voltage level shifter circuit.

In the case where a number of conventional voltage level shifter circuits as shown in FIG. 14 are used in devices such as a decoder and a plurality of conventional voltage level shifter circuits operate simultaneously, "resistance between the terminal T5 and the nodes nd4" are higher than the "resistance between the terminal T4 and the node nd4" in each of the voltage level shifter circuits.

In the conventional level shifter circuit, when a voltage at the node nd4 rises to a value higher than the value "Vpp-Vthp1," the transistor P1 will not be turned on and a voltage at the output terminal T3 will not attain Vpp. Therefore, the transistor P2 will not be turned off. As a result, a through current continues to flow through the transistors P2 and N2.

In the first example, a resistor R1 is inserted between the terminal T4 and the node nd3, so that "resistance between the terminal T4 and the node nd4" is higher than "resistance between the terminal T5 and the node nd4". Accordingly, the voltage level shifter circuit correctly performs an inverting operation.

Example 2

A structure of a voltage level shifter circuit according to a second example of the present invention will now be described with reference to FIG. 2. Note that the like elements are denoted with like reference numerals and characters of the first and second examples, and description thereof will be omitted in the second example for sake of brevity.

Figure 2:
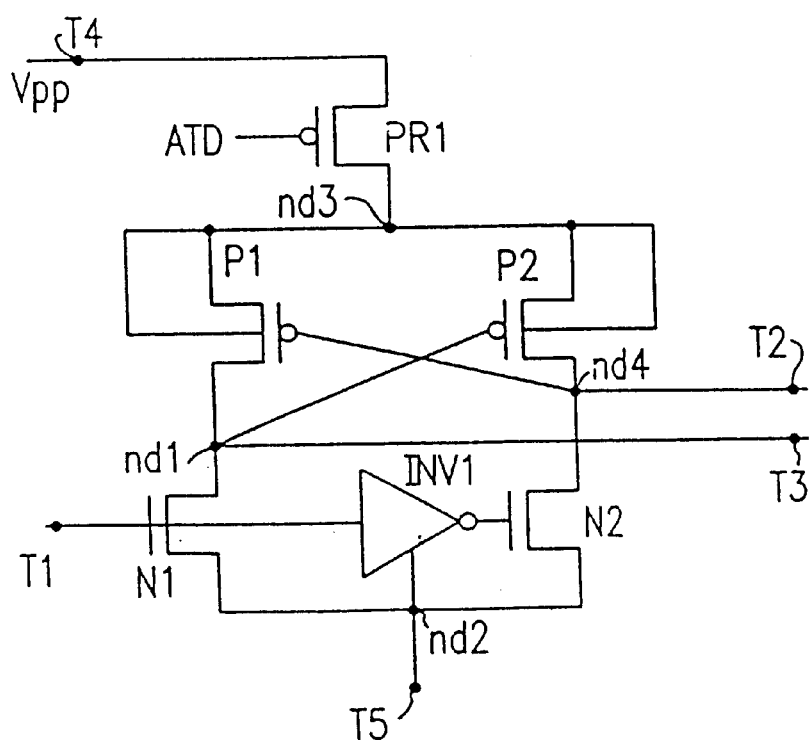
FIG. 2 is a diagram showing a voltage level shifter circuit according to a second example of the present invention.

FIG. 2 shows a structure of the voltage level shifter circuit according to the second example. The structure of the second example is the same as that of the first example except that the voltage level shifter circuit of FIG. 2 has a p-channel MOS transistor PR1 instead of the resistor R1. One of the source and the drain of the MOS transistor PR1 is connected to the terminal T4, whereas the other is connected to the node nd3. The MOS transistor PR1 receives a signal ATD at its gate. The signal ATD is produced by an ATD circuit which will be described later.

Hereinafter, an operation of the voltage level shifter circuit of FIG. 2 at a time when an input signal Si transtions from a voltage Vcc to a reference voltage Vss will be described.

When the input signal Si has a voltage Vcc, the transistors P1 and N2 are turned off, while the transistors N1 and P2 are turned on. At this time, the signal ATD has a reference voltage Vss.

The signal ATD is then caused to transition from a reference voltage Vss to a voltage Vvv, whereby an onstate resistance between the source and the drain of the MOS transistor PR1 is increased. In this case, the voltage Vvv is a voltage which is higher than a reference voltage Vss while being lower than a voltage Vcc. Then, the input signal Si is caused to transition from a voltage Vcc to a reference voltage Vss.

When the input signal Si transitions from a voltage Vcc to a reference voltage Vss, the transistor N1 is first turned off. Then, the inverter INV1 receives the signal of a reference voltage Vss at its input terminal and outputs a signal of a voltage Vcc from its output terminal to the gate of the transistor N2. Accordingly, the transistor N2 is turned on.

In the second example, when the input signal Si transitions from a voltage Vcc to a reference voltage Vss, the current driving capability of the MOS transistor PR1 is degraded, and therefore a resistance between the source and the drain of the MOS transistor PR1 is increased. In other words, "resistance between the terminal T4 and the node nd4 (the total resistance value of on-state resistance of the transistor P2, on-state resistance of the MOS transistor PR1 and parasitic resistance depending on the voltage Vpp)" becomes higher than "the resistance between the terminal T5 and the node nd4 (the total resistance value of on-state resistance of the transistor N2 and parasitic resistance depending on the reference voltage Vss)." Therefore, a current flowing through the nodes nd3, nd4 and nd2 is limited, and a voltage being raised due to the "resistance between the terminals T4 and T5" is reduced. Since a voltage at the output terminal T2 falls to a value lower than the value "Vpp-Vthp1", the transistor P1 is turned on and a voltage at the output terminal T3 attains Vpp.

Figure 3:
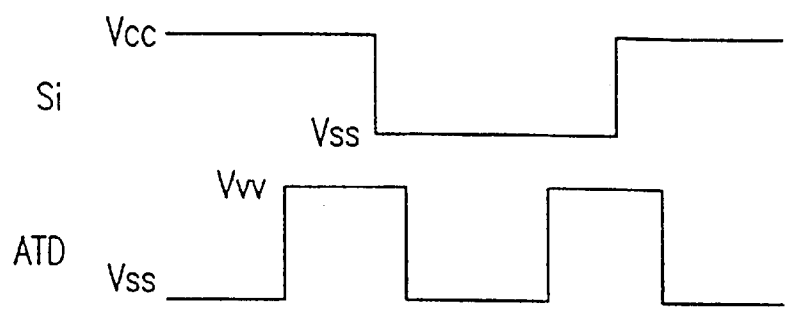
FIG. 3 is an exemplary timing chart of signals input to the voltage level shifter circuit of FIG. 2.

FIG. 3 shows an exemplary timing chart representing a relation between the signal ATD and the input signal Si. The signal ATD is caused to transition from a reference voltage Vss to a voltage Vvv before the input signal Si is caused to transition from a voltage Vcc to a reference voltage Vss, so as to reduce the current driving capability of the MOS transistor PR1. The signal ATD is caused to transition from a voltage Vvv to a reference voltage Vss after the input signal Si is caused to transition from a voltage Vcc to a reference voltage Vss, so as to increase the current driving capability of the MOS transistor PR1.

Figure 4:
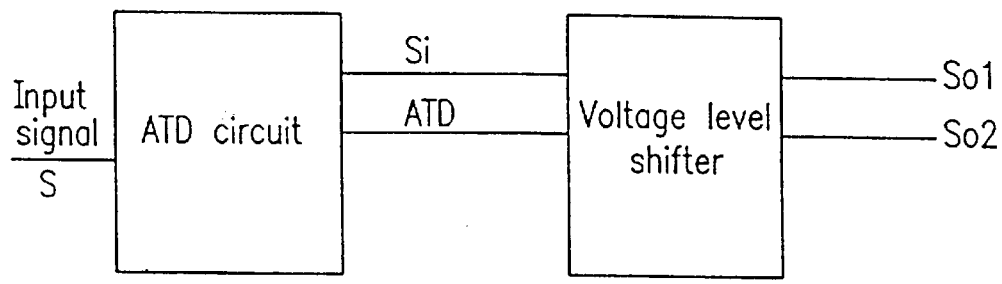
FIG. 4 is a diagram showing a structure of the voltage level shifter circuit and an ATD circuit according to the second example.

FIG. 4 shows an ATD circuit for producing a signal ATD and an input signal Si which are shown in FIG. 3. The ATD circuit produces a signal ATD and an input signal Si based on an input signal S, wherein the input signal S is a signal indicating inversion of voltages at the output terminals of the voltage level shifter circuit. The ATD circuit causes the signal ATD to transition from a reference voltage Vss to a voltage Vvv or from a voltage Vvv to a reference voltage Vss in response to the transition of a voltage level of the input signal S. The ATD circuit causes the input signal Si to transition from a voltage Vcc to a reference voltage Vss after the ATD signal transitions from a reference voltage Vss to a voltage Vvv.

In the case where a voltage level shifter circuit is to be formed on a silicon substrate, the voltage level shifter circuit of FIG. 2 will occupy a smaller area as compared to the voltage level shifter circuit of FIG. 1. This is because an element for making the "resistance between the terminal T4 and the node nd4" larger than the "resistance between the terminal T5 and the node nd4" is constituted by a MOS transistor rather than by a resistor.

Since this element is constituted by a MOS transistor, resistance of this element can be increased when the input signal Si transitions from a voltage Vcc to a reference voltage Vss. Therefore, the voltage level shifter circuit of FIG. 2 correctly performs an inverting operation. Moreover, the use of the voltage level shifter circuit of FIG. 2 enables reduction in power consumption with respect to the voltage level shifter circuit of FIG. 1.

Example 3

A structure of a voltage level shifter circuit according to a third example will now be described with reference to FIG.

5. Note that like elements are denoted with like reference numerals and characters of the first and third examples, and description thereof is omitted in the third example.

Figure 5:
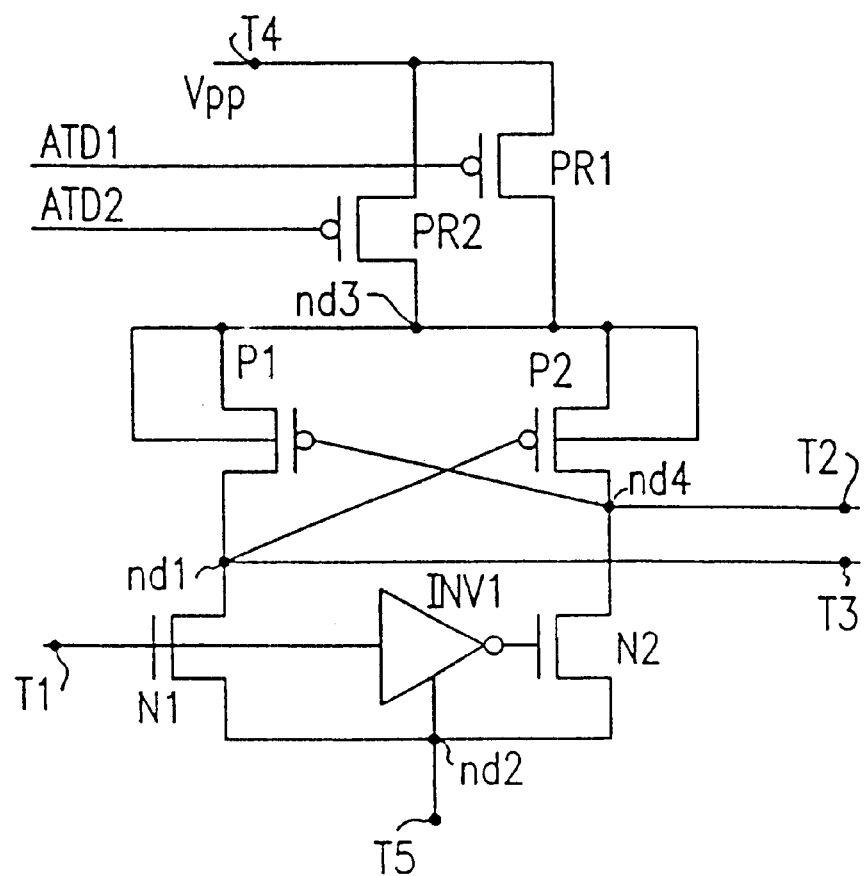
FIG. 5 is a diagram showing a voltage level shifter circuit according to a third example.

FIG. 5 shows a structure of the voltage level shifter circuit according to the third example.

The structure of the third example is the same as that of the first example except that the voltage level shifter circuit of FIG. 5 has p-channel MOS transistors PR1 and PR2 instead of the resistance R1.

The MOS transistors PR1 and PR2 are turned on in response to reception of signals having a reference voltage Vss which are received at their respective gates. Moreover, the MOS transistors PR1 and PR2 are turned off in response to reception of signals having a voltage Vpp which are received at their respective gates. The transistor PR1 is larger in transistor size, that is, in channel width than the transistor PR2. For example, the transistor PR1 has a channel width of 20 μm and the transistor PR2 has a channel width of 5 μm.

One of the source and the drain of the MOS transistor PR1 is connected to the terminal T4, while the other is connected to the node nd3. The MOS transistor PR1 receives a signal ATD1 at its gate. One of the source and the drain of the MOS transistor PR2 is connected to the terminal T4, while the other is connected to the node nd3. The MOS transistor PR2 receives a signal ATD2 at its gate. The signals ATD1 and ATD2 are produced by an ATD circuit which will be described later.

Hereinafter, an operation of the voltage level shifter circuit of FIG. 5 at a time when an input signal Si transtions from a voltage Vcc to a reference voltage Vss will be described.

When the input signal Si has a voltage Vcc, the transistors P1 and N2 are turned off, and the transistors N1 and P2 are turned on. At this time, the signal ATD1 has a reference voltage Vss, and the MOS transistor PR1 is turned on. The signal ATD2 has a voltage Vpp, and therefore the MOS transistor PR2 is turned off.

Then, the signal ATD1 is caused to transition from a reference voltage Vss to a voltage Vpp, whereby the MOS transistor PR1 is turned off. The signal ATD2 is caused to transition from a voltage Vpp to a reference voltage Vss, whereby the MOS transistor PR2 is turned on. Thereafter, the input signal Si is caused to transition from a voltage Vcc to a reference voltage Vss.

When the input signal Si transtions from a voltage Vcc to a reference voltage Vss, the transistor N1 is turned off. Then, the inverter INV1 receives the signal of a reference voltage Vss at its input terminal and outputs a signal of a voltage Vcc from its output terminal to the gate of the transistor N2. As a result, the transistor N2 is turned on.

In the third example, when the input signal Si transtions from a voltage Vcc to a reference voltage Vss, the MOS transistor PR1 is turned off, while the MOS transistor PR2 is turned on. On-state resistance of the MOS transistor PR2 is higher than that of the MOS transistor PR1. Therefore, the "resistance between the terminal T4 and the node nd4 (the total resistance value of on-state resistance of the transistor P2, on-state resistance of the MOS transistor PR2 and parasitic resistance depending on a voltage Vpp)" becomes larger than the "resistance between the terminal T5 and the node nd4 (the total resistance value of on-state resistance of the transistor N2 and parasitic resistance depending on a reference voltage Vss)."

Accordingly, a current flowing through the nodes nd3, nd4 and nd2 is limited, and a voltage being raised due to the "resistance between the terminals T4 and T5" is reduced. Since a voltage at the node nd4 falls to a value lower than the value "Vpp-Vthp1," the transistor P1 is turned on, and a voltage at the output terminal T3 attains Vpp.

Figure 6:
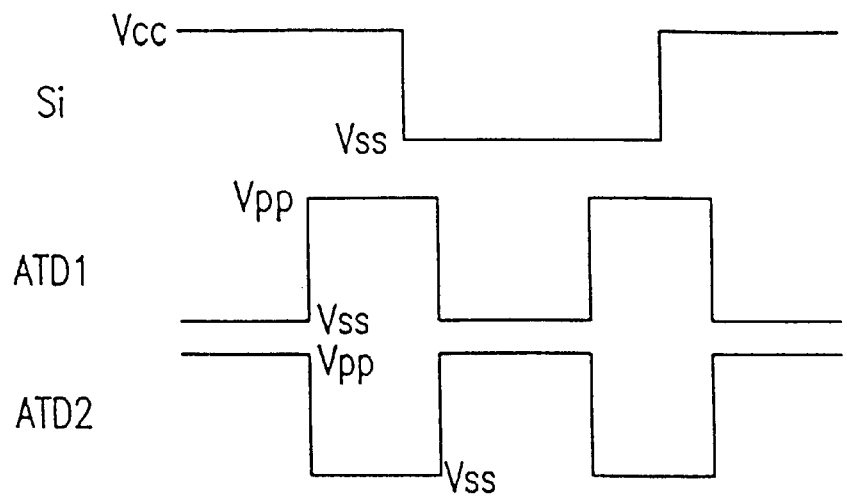
FIG. 6 is an exemplary timing chart of signals input to the voltage level shifter circuit of FIG. 6.

FIG. 6 shows an exemplary timing chart representing a relation between the signals ATD1, ATD2 and the input signal Si. The signal ATD1 is caused to transition from a reference voltage Vss to a voltage Vpp as well as the signal ATD2 is caused to transition from a voltage Vpp to a reference voltage Vss before the input signal Si transtions from a voltage Vcc to a reference voltage Vss, so as to make the "resistance between the terminal T4 and the node nd4" larger than the "resistance between the terminal T5 and the node nd4." After the input signal Si transtions from a voltage Vcc to a reference voltage Vss, the signal ATD1 is caused to transition from a voltage Vpp to a reference voltage Vss as well as the signal ATD2 is caused to transition from a reference voltage Vss to a voltage Vpp.

Figure 7:
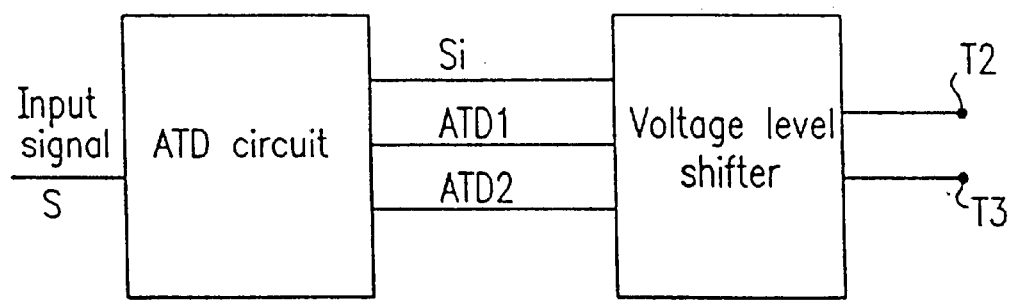
FIG. 7 is a diagram showing a structure of the voltage level shifter circuit and an ATD circuit according to the third example.

FIG. 7 shows the ATD circuit for producing signals ATD1 and ATD2 which are shown in FIG. 6. The ATD circuit produces signals ATD1 and ATD2 and an input signal Si based on an input signal S, wherein the input signal S is a signal indicating inversion of voltages at the output terminals of the voltage level shifter circuit. The ATD circuit causes the signal ATD1 to transition from a reference voltage Vss to a voltage Vpp as well as causes the signal ATD2 to transition from a voltage Vpp to a reference voltage Vss in response to the transition of a voltage level of the input signal S. The ATD circuit causes the input signal Si to transition from a voltage Vcc to a reference voltage Vss after the lapse of a prescribed time period from the transition of the signals ATD1 and ATD2.

When a voltage of the input signal Si transtions from a voltage Vcc to a reference voltage Vss, only the MOS transistor PR2 having inferior current driving capability is turned on. However, when a voltage of the input signal Si does not transition from a voltage Vcc to a reference voltage Vss (i.e., in a steady state), the MOS transistor PR1 having superior current driving capability is turned on. Therefore, the voltage level shifter circuit of FIG. 5 can stably output a signal having a voltage Vpp from the output terminal T2 or T3 in a steady state, as compared to the voltage level shifter circuit of FIG. 2.

Example 4

A structure of the voltage level shifter circuit according to a fourth example of the present invention will now be described with reference to FIG. 8.

Figure 8:
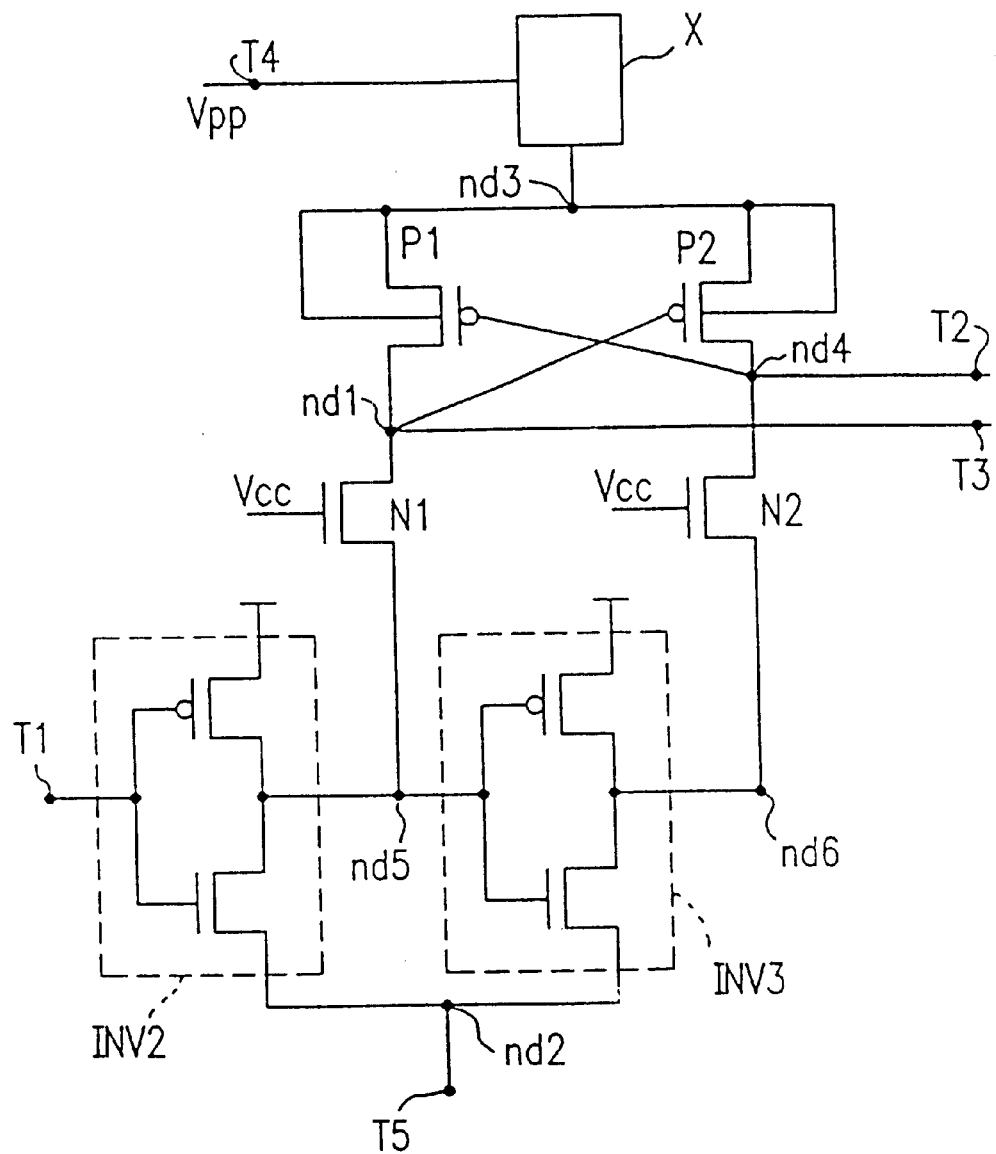
FIG. 8 is a diagram showing a voltage level shifter circuit according to a fourth example of the present invention.

FIG. 8 shows a structure of the voltage level shifter circuit of the fourth example. This voltage level shifter circuit changes respective voltages of output signals So1 and So2 which are output from respective output terminals T2 and T3, according to a voltage of the input signal Si input to an input terminal T1.

The voltage level shifter circuit of FIG. 8 includes transistors P1, P2, N1 and N2 each having a source, a drain and a gate; inverters INV2 and INV3; an element which is equivalent to a resistor (hereinafter, referred to as a resistance equivalent element) X; an input terminal T1; output terminals T2 and T3; and terminals T4 and T5.

The connection of the above-described structure will now be described.

The input terminal T1 is connected to an input terminal of the inverter INV2. An output terminal of the inverter INV2 is connected through a node nd5 to an input terminal of the inverter INV3. An output terminal of the inverter INV3 is connected to a node nd6. One of terminals for supplying a voltage to the inverter INV2 is connected to a first power supply (not shown), whereas the other is connected through a node nd2 to the terminal T5. One of terminals for supplying a voltage to the inverter INV3 is connected to the first power supply (not shown), whereas the other is connected through the node nd2 to the terminal T5.

One of the source and the drain of the transistor N1 is connected to a node nd1, whereas the other is connected to the node nd5. The transistor N1 continuously receives a voltage Vcc at its gate. The node nd1 is connected to the terminal T3 for outputting an output signal So2.

One of the source and the drain of the transistor P1 is connected to a node nd3, whereas the other is connected to the node nd1. One of the gates of the transistor P1 is connected to the node nd3, whereas the other is connected to a node nd4. The node nd3 is connected through the resistance equivalent element X to the terminal T4 which receives a voltage Vpp. The node nd4 is connected to the terminal T2 for outputting an output signal So1.

One of the source and the drain of the transistor P2 is connected to the node nd3, whereas the other is connected to the node nd4. One of the gates of the transistor P2 is connected to the node nd3, whereas the other is connected to the node nd1.

One of the source and the drain of the transistor N2 is connected to the node nd4, whereas the other is connected to the node nd6. The transistor N2 continuously receives a voltage Vcc at its gate.

Hereinafter, an operation of the voltage level shifter circuit shown in FIG. 8 at a time when a voltage of an input signal Si transtions from a voltage Vcc to a reference voltage Vss will be described.

When the input signal Si has a voltage Vcc, a voltage at the node nd5 is Vss, and a voltage at the node nd6 is Vcc. In this case, the transistor P1 is turned off, whereas the transistor P2 is turned on.

When the input signal Si transitions from a voltage Vcc to a reference voltage Vss, a voltage at the node nd5 attains Vcc. Since the transistor P1 is in an off state, a voltage at the node nd1 and thus at the output terminal T3 rises to the value "Vcc-Vthn1", where Vthn1 is a threshold voltage for turning on the transistor N1.

Thus, a voltage at the node nd6 is Vss. Since a voltage at the gate of the transistor P2 has the value Vcc-Vthn1, the transistor P2 is still in an on state. Therefore, a through current may flow through the transistors P2 and N2, causing a voltage at the node nd2 to rise.

In the voltage level shifter circuit of the fourth example, a resistance equivalent element X is inserted between the terminal T4 and the node nd4. Therefore, a current flowing through the nodes nd3, nd4 and nd2 is limited, and a voltage being raised due to the "resistance between the node nd4 and the terminal T5" as described above is suppressed. In other words, a voltage at the output terminal T2 can be reduced by increasing a resistance value of the resistance equivalent element. As a result, the voltage level shifter circuit of FIG. 8 correctly performs an inverting operation.

The resistance equivalent element X may be such a resistor as in the first example as long as the "resistance between the terminal T4 and the node nd4" is larger than the "resistance between the terminal T5 and the node nd4." In the case where the voltage level shifter circuit of FIG. 8 is to be formed on a silicon substrate, the above-mentioned resistance may be a diffused resistance. This resistance may also be formed of polysilicon.

The resistance equivalent element X may be such a p-channel MOS transistor as in the second example as long as the "resistance between the terminal T4 and the node nd4" is larger than the "resistance between the terminal T5 and the node nd4."

The resistance equivalent element X may include such a p-channel MOS transistor and another p-channel MOS transistor having a smaller channel width than the p-channel MOS transistor, as in the third example, as long as the "resistance between the terminal T4 and the node nd4" is larger than the "resistance between the terminal T5 and the node nd4."

Example 5

A structure of a voltage level shifter circuit according to a fifth example of the present invention will now be described with reference to FIG. 9.

Figure 9:
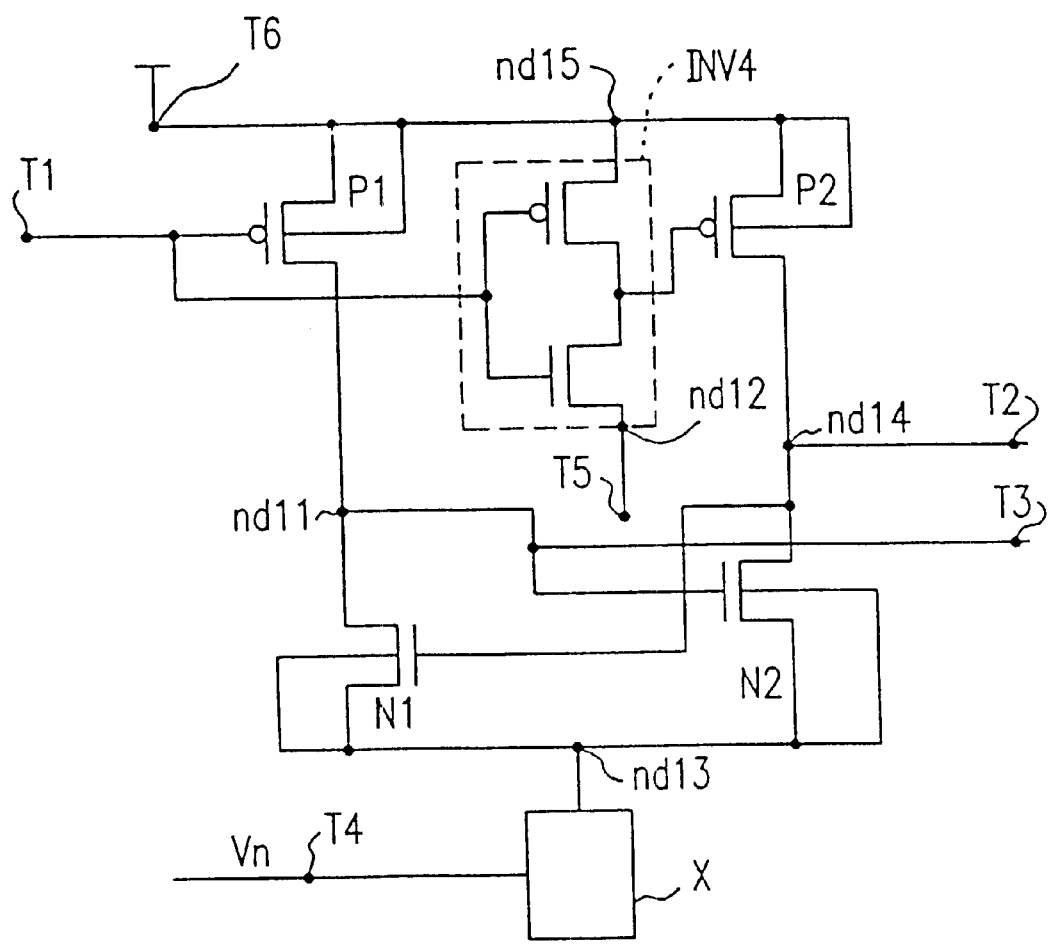
FIG. 9 is a diagram showing a voltage level shifter circuit according to a fifth example of the present invention.

FIG. 9 shows a structure of the voltage level shifter circuit of the fifth example. This voltage level shifter circuit changes respective voltage levels of output signals So1 and So2 output from respective output terminals T2 and T3, according to a voltage of an input signal Si input to an input terminal T1. In the fifth example, the output signal So1 has voltage Vcc or Vn, where Vn is a negative voltage, and the output signal So2 has voltage Vcc or Vn, where Vn is a negative voltage.

The voltage level shifter circuit of FIG. 9 includes transistors P1, P2, N1 and N2 each having a source, a drain and gates; an inverter INV4; a resistance equivalent element X; an input terminal T1; output terminals T2 and T3; and terminals T4, T5 and T6.

The connection of the above-mentioned structure will now be described.

The input terminal T1 is connected to an input terminal of the inverter INV4. The input terminal T1 is further connected to one of the gates of the transistor P1. The other of the gates of the transistor P1 is connected to a node nd15. One of the source and the drain of the transistor P1 is connected to the node nd15, whereas the other is connected to a node nd11. The node nd11 is connected to the terminal T3 for outputting an output signal So2.

One of the source and the drain of the transistor P2 is connected to the node nd15, whereas the other is connected to a node nd14. One of the gates of the transistor P2 is connected to an output terminal of the inverter INV4, whereas the other is connected to the node nd15.

One of the terminals for supplying a voltage to the inverter INV4 is connected to the node nd15, whereas the other is connected through the node nd12 to the terminal T5. A voltage Vss is applied to the terminal T5.

One of the source and the drain of the transistor N1 is connected to the node nd11, whereas the other is connected to a node nd13. One of the gates of the transistor N1 is connected to the node nd14, whereas the other is connected to the node nd13. The node nd13 is in turn connected through the resistance equivalent element X to the terminal T4 for applying a voltage Vn. The node nd14 is connected to the terminal T2 for outputting an output signal So1.

One of the source and the drain of the transistor N2 is connected to the node nd14, whereas the other is connected to the node nd13. One of the gates of the transistor N2 is connected to the node nd11, whereas the other is connected to the node nd13.

Hereinafter, an operation of the voltage level shifter circuit of FIG. 9 at a time when an input signal Si transitions from a reference voltage Vss to a voltage Vcc will be described.

When the input signal Si has a reference voltage Vss, the transistor Pi is turned on, whereas the transistor P2 is turned off. Therefore, the transistor N1 is turned off, and the transistor N2 is turned on. As a result, the voltage level shifter circuit outputs a signal So1 having a voltage Vn from its output terminal T2 as well as outputs a signal So2 having a voltage Vcc from its output terminal T3.

When the input signal Si transtions from a reference voltage Vss to a voltage Vcc, the transistor P1 changes from on-state to off-state. Then, the transistor P2 changes from off-state to on-state.

Figure 16:
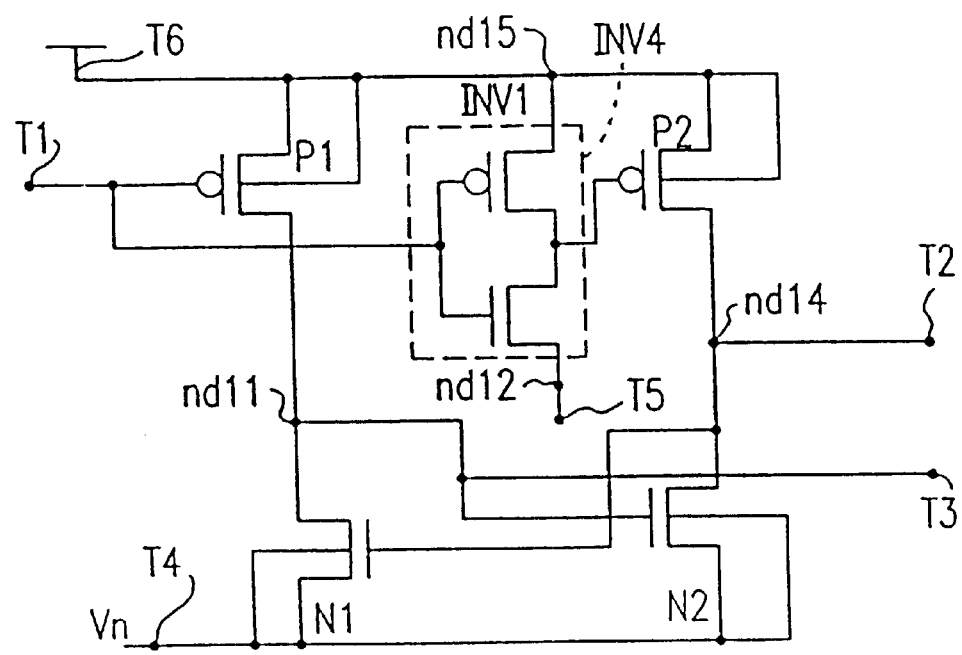
FIG. 16 is a diagram showing still another conventional voltage level shifter circuit.

In the voltage level shifter circuit of FIG. 9, the resistance equivalent element X is inserted between the terminal T4 and the node nd13. Accordingly, a voltage drop at the node nd14 is less likely to occur as compared to the voltage level shifter circuit of FIG. 16. In other words, since the resistance equivalent element X is inserted between the terminal T4 and the node nd13 in the voltage level shifter circuit of the fifth example, a current flowing through the nodes nd15, nd14 and nd13 is limited. As a result, the voltage level shifter circuit of the fifth example correctly performs an inverting operation.

The resistance equivalent element X may be such a resistor as in the first example as long as "resistance between the terminal T4 and the node nd14" is larger than "resistance between the terminal T6 and the node nd14." In the case where the voltage level shifter circuit of FIG. 9 is to be formed on a silicon substrate, this resistance may be a diffused resistance. This resistance may also be formed of polysilicon.

The resistance equivalent element X may be such a p-channel MOS transistor as in the second example as long as the "resistance between the terminal T4 and the node nd14" is larger than the "resistance between the terminal T6 and the node nd14."

The resistance equivalent element X may include such a p-channel MOS transistor and another p-channel MOS transistor having a smaller channel width than the p-channel transistor, as in the third example, as long as the "resistance between the terminal T4 and the node nd14" is larger than the "resistance between the terminal T6 and the node nd14."

Example 6

A voltage level shifter circuit according to a sixth example of the present invention will now be described with reference to FIG. 10.

Figure 10:
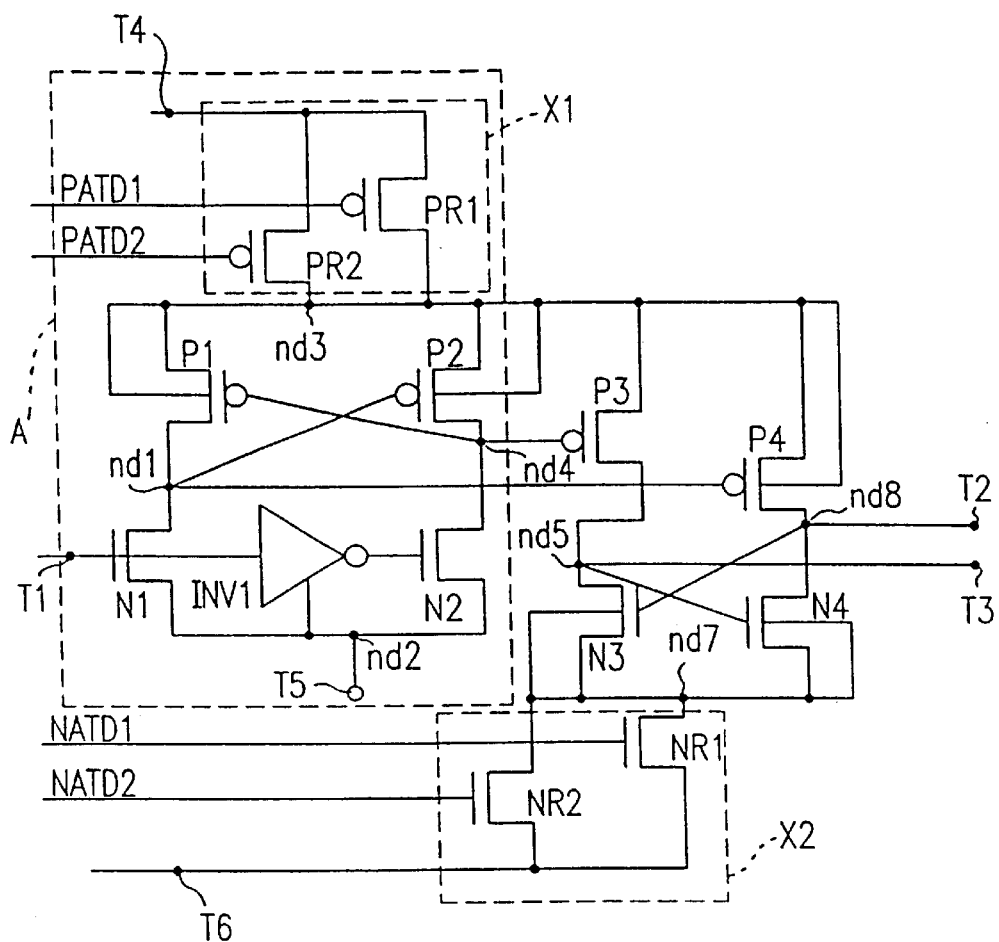
FIG. 10 is a diagram showing a voltage level shifter circuit according to a sixth example of the present invention.

FIG. 10 shows a structure of the voltage level shifter circuit of the sixth example. The voltage level shifter circuit of FIG. 10 changes respective voltage levels of output signals So1 and So2 output from respective output terminals T2 and T3, based on an input signal Si, signals PATD1, PATD2, NATD1 and NATD2. In the sixth example, the output signal So1 has voltage Vpp or Vn, where Vn is a negative voltage. The output signal So2 has voltage Vpp or Vn, where Vn is a negative voltage.

The voltage level shifter circuit of FIG. 10 includes a portion A, transistors P1, P2, P3, P4, N1, N2, N3 and N4 each having a source, a drain, and gates; an inverter INV1; p-channel MOS transistors PR1 and PR2; n-channel MOS transistors NR1 and NR2; an input terminal T1; output terminals T2 and T3; and terminals T4, T5 and T6.

The connection of the above-mentioned structure will now be described.

The portion A includes a resistance equivalent element X1, transistors P1, P2, N1 and N2, an inverter INV1, and an input terminal T1. This resistance equivalent element X1 of the voltage level shifter circuit of FIG. 10 has p-channel MOS transistors PR1 and PR2. The transistor PR1 has a larger channel width than the transistor PR2. For example, the transistor PR1 has a channel width of 20 $\mu$m and the transistor PR2 has a channel width of 5 $\mu$m. The structure of the portion A of FIG. 10 is the same as that of the above-described voltage level shifter circuit of FIG. 5. Therefore, detailed description of the portion A will be omitted.

A node nd4 in the portion A is connected to one of the gates of the transistor P3, and the other of the gates is connected to a node nd3 in the portion A. One of the source and the drain of the transistor P3 is connected to the node nd3, whereas the other is connected to a node nd5. The node nd5 is connected to the terminal T3 for outputting an output signal So2.

One of the source and the drain of the transistor P4 is connected to the node nd3, whereas the other is connected to a node nd8. One of the gates of the transistor P4 is connected to a node nd1 in the portion A, whereas the other is connected to the node nd3. The node nd8 is connected to the terminal T2 for outputting an output signal So1.

One of the source and the drain of the transistor N3 is connected to the node nd5, whereas the other is connected to a node nd7. One of the gates of the transistor N3 is connected to the node nd8, whereas the other is connected to the node nd7. The gate of transistor N3 is connected to the terminal T2 for outputting an output signal So1.

One of the source and the drain of the transistor N4 is connected to the node nd8, whereas the other is connected to the node nd7. One of the gates of the transistor N4 is connected to the node nd5, whereas the other is connected to the node nd7.

The node nd7 is connected through a resistance equivalent element X2 to the terminal T6. The resistance equivalent element X2 of the voltage level shifter circuit of FIG. 10 has n-channel MOS transistors NR1 and NR2. The transistor NR1 has a larger channel width than the transistor NR2. For example, the transistor NR1 has a channel width of 20 $\mu$m, and the transistor NR2 has a channel width of 5 $\mu$m.

Figure 11:
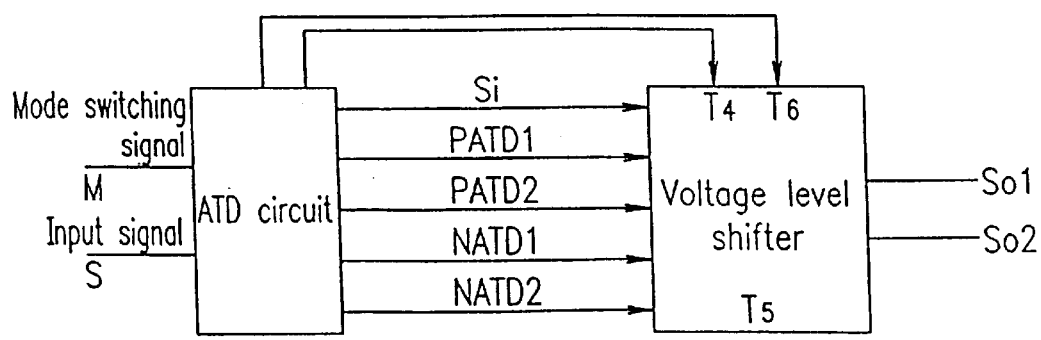
FIG. 11 is a diagram showing a structure of the voltage level shifter circuit and an ATD circuit according to the sixth example.

An ATD circuit of FIG. 11 receives an input signal S and a mode switching signal M, and produces an input signal Si and signals PATD1, PATD2, NATD1 and NATD2 based on the received signals S and M. The signals PATD1, PATD2, NATD1 and NATD2 are respectively input to the transistors PR1, PR2, NR1 and NR2. The input signal S has voltages Vcc and Vss.

In the case where the mode switching signal M is a signal indicating the voltage level shifter circuit of FIG. 10 to serve as a positive voltage level shifter, respective voltages at the terminals T2 and T3 are Vss or Vpp. In this case, a voltage Vpp is applied to the terminal T4, and a voltage Vss is applied to the terminal T6. In addition, a voltage Vss is applied to the terminal T5.

In the case where the mode switching signal M is a signal indicating the voltage level shifter circuit of FIG. 10 to serve as a negative voltage level shifter, respective voltages at the terminals T2 and T3 are Vss or Vn. In this case, a voltage Vcc is applied to the terminal T4, and a voltage Vn is applied to the terminal T6. In addition, a voltage Vss is applied to the terminal T5.

Figure 12:
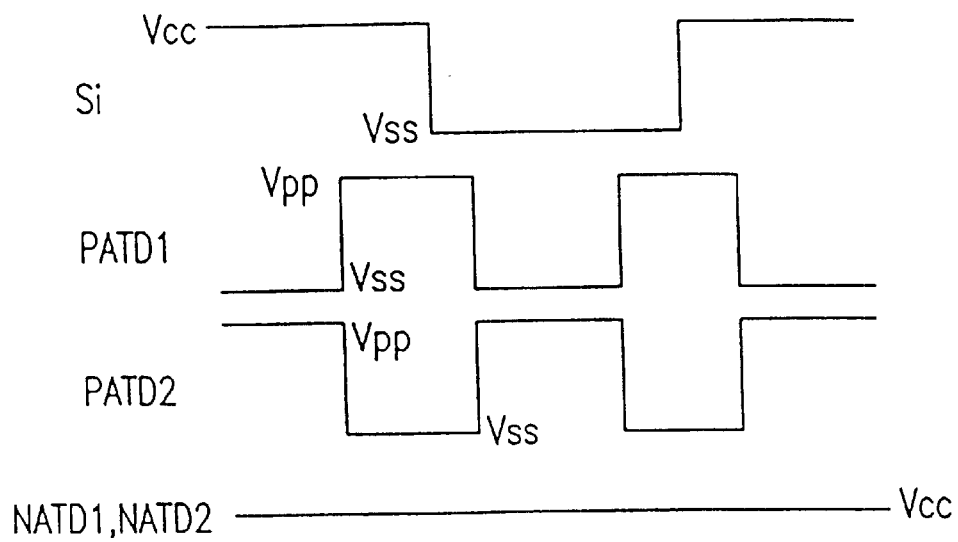
FIG. 12 is an exemplary timing chart of signals input to the voltage level shifter circuit of FIG. 11.
Figure 13:
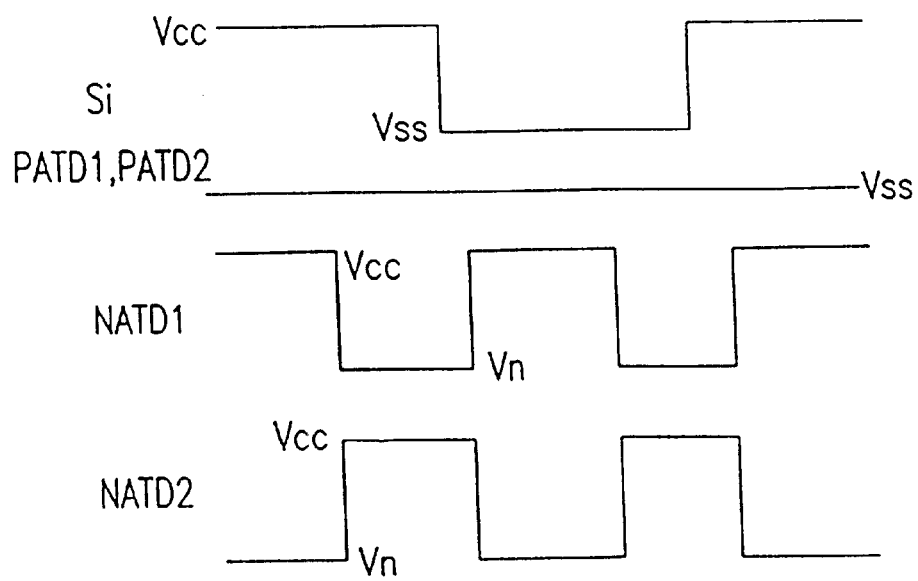
FIG. 13 is another exemplary timing chart of signals input to the voltage level shifter circuit of FIG. 11.

FIG. 12 shows an exemplary timing chart of the input signal Si and the signals PATD1, PATD2, NATD1 and NATD2 obtained in the case where a mode switching signal M indicating the voltage level shifter circuit to serve as a positive voltage level shifter is input to the ATD circuit shown in FIG. 11. FIG. 13 shows an exemplary timing chart of the input signal Si and the signals PATD1, PATD2, NATD1 and NATD2 obtained in the case where a mode switching signal M indicating the voltage level shifter circuit to serve as a negative voltage level shifter is input to the ATD circuit shown in FIG. 11.

An operation of the voltage level shifter circuit of FIG. 10 serving as a positive voltage level shifter will now be described. The ATD circuit of FIG. 11 receives a mode switching signal M indicating the voltage level shifter circuit of FIG. 10 to serve as a positive voltage level shifter, and an input signal S indicating transition of an input signal Si from a reference voltage Vss to a voltage Vcc. As described above, a voltage Vpp is applied to the terminal T4 and a voltage Vcc is applied to the terminal T6. A voltage Vss is continuously applied to the terminal T5.

In an initial state, a signal PATD1 has a voltage Vss and a signal PATD2 has a voltage Vpp. Accordingly, the transistor PR1 is turned on, whereas the transistor PR2 is turned off. At this time, signals NATD1 and NATD2 have a voltage Vcc, and the transistors NR1 and NR2 are turned on.

In this initial state, an input signal Si has a voltage Vcc. Therefore, the transistors N1 and P2 are turned on, whereas the transistors N2 and P1 are turned off. At this time, a voltage at the node nd1 is Vss and a voltage at the node nd4 is Vpp.

Accordingly, the transistors N3 and P4 are turned on, whereas the transistors N4 and P3 are turned off. As a result, the voltage level shifter circuit outputs a signal So1 of a voltage Vpp and a signal So2 of a voltage Vss from its output terminals T2 and T3, respectively.

The signal PAD1 is caused to transition from a voltage Vss to a voltage Vpp as well as the signal PAD2 is caused to transition from a voltage Vpp to a voltage Vss before the input signal Si is caused to transition from a reference voltage Vss to a voltage Vcc. Accordingly, the transistor PR1 is turned off, whereas the transistor PR2 is turned on. At this time, the signals NATD1 and NATD2 are kept at a voltage Vcc.

When the input signal Si transtions from a voltage Vcc to a reference voltage Vss, the transistor N1 is turned off. A signal output from the inverter INV1 transitions to a voltage Vcc. Therefore, the transistor N2 is turned on. Since the transistor P2 is still in an on state, a through current flows through the terminals T4 and T5. The transistor PR2 has inferior current driving capability as compared to the transistor PR1. This is because the transistor PR2 has a smaller channel width than the transistor PR1. At this time, the transistor PR2 having inferior current driving capability is in an off state, while the transistor PR1 having superior current driving capability is in an on state as described above. Therefore, this through current is suppressed. As a result, a voltage at the node nd4 falls to a value smaller than the value "Vpp-Vthp2", and the transistor P1 is turned on. Note that Vthp2 is a threshold voltage for turning on the transistor P2.

As a result, the transistors P3 and N4 are turned on, whereas the transistors N3 and P4 are turned off. Thus, the voltage level shifter circuit outputs a signal So1 of a voltage Vss from the terminal T2 and also outputs a signal So2 of a voltage Vpp from the terminal T3.

An operation of the voltage level shifter circuit of FIG. 10 serving as a negative voltage level shifter will now be described. The ATD circuit of FIG. 11 receives a mode switching signal M indicating the voltage level shifter circuit of FIG. 10 to serve as a negative voltage level shifter, and an input signal S indicating transition of an input signal Si from a reference voltage Vss to a voltage Vcc. As described above, a voltage Vcc is applied to the terminal T4 and a voltage Vn is applied to the terminal T6. A voltage Vss is continuously applied to the terminal T5.

In an initial state, a signal NATD1 has a voltage Vcc and a signal NATD2 has a voltage Vn. Accordingly, the transistor NR1 is turned on, whereas the transistor NR2 is turned off. At this time, signals PATD1 and PATD2 have a voltage Vss, and the transistors PR1 and PR2 are turned on.

In this initial state, an input signal Si has a voltage Vcc. Therefore, the transistors N1 and P2 are turned on, whereas the transistors N2 and P1 are turned off. At this time, a voltage at the node nd1 is Vss and a voltage at the node nd4 is Vcc.

Accordingly, the transistors N3 and P4 are turned on, whereas the transistors N4 and P3 are turned off. As a result, the voltage level shifter circuit outputs a signal So1 of a voltage Vcc and a signal So2 of a voltage Vn from its output terminals T2 and T3, respectively.

The signal NATD1 is caused to transition from a voltage Vcc to a voltage Vn as well as the signal NATD2 is caused to transition from a voltage Vn to a voltage Vcc before the input signal Si is caused to transition from a voltage Vss to a voltage Vcc. Accordingly, the transistor NR1 is turned off, whereas the transistor NR2 is turned on. At this time, the signals PATD1 and PATD2 are kept at a voltage Vss.

When the input signal Si transtions from a voltage Vcc to a voltage Vss, the transistor N1 is turned off. A signal output from the inverter INV1 then transitions to a voltage Vcc. Therefore, the transistor N2 is turned on.

Thus, a voltage at the node nd1 attains Vcc, whereas a voltage at the node nd4 is rendered at Vss. Therefore, the transistor P3 is turned on, whereas the transistor P4 is turned off.

Since the transistor N3 is still in an on state, a through current flows through the terminals T4 and T6. The transistor NR2 has inferior current driving capability as compared to the transistor NR1. This is because the transistor NR2 has a smaller channel width than the transistor NR1. At this time, the transistor NR1 having superior current driving capability is in an off state, while the transistor NR2 having inferior current driving capability is in an on state as described above. Therefore, this through current is suppressed.

As a result, a voltage at the node nd5 rises to a value higher than the value "Vpp-Vthn4", and the transistor N4 is turned on. Note that Vthn4 is herein a threshold voltage for turning on the transistor N4.

As a result, the transistors P3 and N4 are turned on, whereas the transistors N3 and P4 are turned off. Thus, the voltage level shifter circuit outputs a signal So1 of a voltage Vss from the terminal T2 and also outputs a signal So2 of a voltage Vpp from the terminal T3. Thus, the voltage level shifter circuit correctly performs an inverting operation.

The voltage level shifter circuit of the present invention includes first and second transistors, a switching section for receiving an input signal and changing respective voltages to be supplied to first and second nodes, and a resistance equivalent element having its one end receiving a high voltage or a negative voltage and another end connected to a third node.

One of the source and the drain of the first transistor and one of the source and the drain of the second transistor are connected to the third node. The other of the source and the drain of the first transistor and a gate of the second transistor are connected to the first node. The other of the source and the drain of the second transistor and a gate of the first transistor are connected to the second node.

The voltage level shifter circuit of the present invention has a higher resistance value between the node to which a high voltage or a negative voltage is applied and the second node, as compared to the voltage level shifter circuit in which a high voltage or a negative voltage is applied directly to the third node. Therefore, the voltage level shifter circuit of the present invention can suppress a through current which flows through the second transistor and the switching section when a voltage of an input signal is changed. As a result, the voltage level shifter circuit of the present invention can perform an inverting operation even when a voltage of an input signal is changed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A voltage level shifter circuit, comprising:
    a first transistor having a source, a drain, a backgate, and a gate;
    a second transistor having a source, a drain, a backgate, and a gate;
    a switching section for receiving an input signal and changing respective voltages to be applied to first and second nodes, wherein
    one of the source and the drain of each of the first and second transistors is connected to a third node,
    the backgate of each of the first and second transistors is connected to the third node,
    the other of the source and the drain of the first transistor and the gate of the second transistor are connected to the first node, and
    the other of the source and the drain of the second transistor and the gate of the first transistor are connected to the second node, the voltage level shifter circuit further comprising:
    a resistance equivalent element having first and second ends, a high voltage being applied to the first end, and the second end being connected to the third node, and having a resistance such that a total resistance between the first end and the second node is larger than a total resistance between the input terminal and the second node since both a transistor and a resistor are coupled between a first end and the second node while only a transistor is coupled between the input terminal and the second node, wherein during operation of the voltage level shifter circuit an input signal transitions from a voltage Vcc to a reference voltage Vss, the resistance equivalent element restricts current flow and the second transistor is cutoff.

2. A voltage level shifter circuit according to claim 1, wherein the resistance equivalent element is a resistor.

3. A voltage level shifter circuit according to claim 1, wherein the resistance equivalent element has at least one p-channel MOS transistor.

4. A voltage level shifter circuit according to claim 3, wherein a signal being applied to a gate of the at least one p-channel MOS transistor is caused to transition from a reference voltage Vss to a voltage Vvv before the input signal is caused to transition from a voltage Vcc to the reference voltage Vss, wherein Vss <Vvv <Vcc.

5. A voltage level shifter circuit according to claim 4, wherein the signal being applied to the gate of the at least one p-channel MOS transistor is caused to transition from the voltage Vvv to the reference voltage Vss after the input signal is caused to transition from the voltage Vcc to the reference voltage Vss.

6. A voltage level shifter circuit according to claim 1, wherein the resistance equivalent element has first and second p-channel MOS transistors, and a channel width of the first p-channel MOS transistor is larger than a channel width of the second p-channel MOS transistor.

7. A voltage level shifter circuit, comprising:
    a first transistor having a source, a drain, a backgate, and a gate;
    a second transistor having a source, a drain, a backgate, and a gate; and
    a switching section for receiving an input signal and changing respective voltages to be applied to first and second nodes, wherein
    one of the source and the drain of each of the first and second transistors is connected to a third node,
    the backgate of each of the first and second transistors is connected to the third node,
    the other of the source and the drain of the first transistor and the gate of the second transistor are connected to the first node, and
    the other of the source and the drain of the second transistor and the gate of the first transistor are connected to the second node, the voltage level shifter circuit further comprising:
    an additional transistor having a source and a drain, one of the source and the drain connected to the second node, the other of the source and the drain connected to an input terminal; and
    a resistance equivalent element having first and second ends, a negative voltage being applied to the first and, and the second end being connected to the third node, and having a resistance such that a total resistance between the first end and the second node is larger than a total resistance between the input terminal and the second node since both a transistor and a resistor are coupled between a first end and the second node while only a transistor is coupled between the input terminal and the second node, wherein during operation of the voltage level shifter circuit an input signal transitions from a voltage Vcc to a reference voltage Vss, the resistance equivalent element restricts current flow and the second transistor is cutoff;

8. A voltage level shifter circuit according to claim 7, wherein the resistance equivalent element is a resistor.

9. A voltage level shifter circuit according to claim 7, wherein the resistance equivalent element has at least one n-channel MOS transistor.

10. A voltage level shifter circuit according to claim 7, wherein the resistance equivalent element has first and second n-channel MOS transistors, and a channel width of the first n-channel MOS transistor is larger than a channel width of the second n-channel MOS transistor.

11. A voltage level shifter circuit, comprising:
    a first transistor having a source, a drain, a backgate, and a gate;
    a second transistor having a source, a drain, a backgate, and a gate;
    a third transistor having a source, a drain, a backgate, and a gate;

a fourth transistor having a source, a drain, a backgate, and a gate; and a first switching section for receiving an input signal and changing respective voltages to be applied to first and second nodes, wherein one of the source and the drain of each of the first and second transistors is connected to a third node, the backgate of each of the first and second transistors is connected to the third node, the other of the source and the drain of the first transistor and the gate of the second transistor are connected to the first node, the other of the source and the drain of the second transistor and the gate of the first transistor are connected to the second node, one of the source and the drain of each of the third and fourth transistors is connected to a fourth node, the backgate of each of the third and fourth transistors is connected to the fourth node, the other of the source and the drain of the third transistor and the gate of the fourth transistor are connected to a fifth node, and the other of the source and the drain of the fourth transistor and the gate of the third transistor are connected to a sixth node, the voltage level shifter circuit further comprising:

a second switching section for changing respective voltages to be applied to the fifth and sixth nodes based on respective voltages at the first and second nodes;

an additional transistor having a source and a drain, one of the source and the drain connected to the second node, the other of the source and the drain connected to an input terminal;

a first resistance equivalent element having first and second ends, a voltage being applied to the first end, and the second end being connected to the third node, and having a resistance such that a total resistance between the first end and the second node is larger than a total resistance between the input terminal and the second node; and a second resistance equivalent element having first and second ends, a negative voltage being applied to the first end of the second resistance equivalent element, and the second end of the second resistance equivalent element being connected to the fourth node.

12. A voltage level shifter circuit according to claim 11, wherein the first and second resistance equivalent elements are resistance elements.

13. A voltage level shifter circuit according to claim 11, wherein the first resistance equivalent element has at least one p-channel MOS transistor and the second resistance equivalent element has at least one n-channel MOS transistor.

14. A voltage level shifter circuit according to claim 11, wherein the first resistance equivalent element has first and second p-channel MOS transistors, a channel width of the first p-channel MOS transistor being larger than a channel width of the second p-channel MOS transistor, and the second resistance equivalent element has first and second n-channel transistors, a channel width of the first n-channel MOS transistor being larger than a channel width of the second n-channel MOS transistor.

15. A voltage level shifter circuit, comprising:

a first transistor having a source, a drain, a backgate, and a gate;

a second transistor having a source, a drain, a backgate, and a gate;

a switching section for receiving an input signal and changing respective voltages to be applied to first and second nodes, wherein one of the source and the drain of each of the first and second transistors is connected to a third node, the backgate of each of the first and second transistors is connected to the third node, the other of the source and the drain of the first transistor and the gate of the second transistor are connected to the first node, and the other of the source and the drain of the second transistor and the gate of the first transistor are connected to the second node, the voltage level shifter circuit further comprising:

a resistance equivalent element having first and second ends, a high voltage being applied to the first end, and the second end being connected to the third node, and having a resistance such that a total resistance between the first end and the second node is larger than a total resistance between the input terminal and the second node, wherein the transistor coupled between a first end and the second node may have a resistance value less than the resistance value of the transistor coupled between the input terminal and the second node, wherein during operation of the voltage level shifter circuit an input signal transitions from a voltage Vcc to a reference voltage Vss and the resistance equivalent element restricts current flow and the second transistor is cutoff.

16. A voltage level shifter circuit, comprising:

a first transistor having a source, a drain, a backgate, and a gate;

a second transistor having a source, a drain, a backgate, and a gate; and a switching section for receiving an input signal and changing respective voltages to be applied to first and second nodes, wherein one of the source and the drain of each of the first and second transistors is connected to a third node, the backgate of each of the first and second transistors is connected to the third node, the other of the source and the drain of the first transistor and the gate of the second transistor are connected to the first node, and the other of the source and the drain of the second transistor and the gate of the first transistor are connected to the second node, the voltage level shifter circuit further comprising:

an additional transistor having a source and a drain, one of the source and the drain connected to the second node, the other of the source and the drain connected to an input terminal; and a resistance equivalent element having first and second ends, a negative voltage being applied to the first and, and the second end being connected to the third node, and having a resistance such that a total resistance between the first end and the second node is larger than a total resistance between the input terminal and the second node, wherein the transistor coupled between a first end and the second node may have a resistance value less than the resistance value of the transistor coupled between the input terminal and the second node, wherein during operation of the voltage level shifter circuit an input signal transitions from a voltage Vcc to a reference voltage Vss, the resistance equivalent element restricts current flow and the second transistor is cutoff.

* * * * *